(12) United States Patent
Iida et al.

(10) Patent No.: US 12,274,090 B2
(45) Date of Patent: Apr. 8, 2025

(54) SEMICONDUCTOR INTEGRATED CIRCUIT DEVICE

(71) Applicant: Socionext Inc., Kanagawa (JP)

(72) Inventors: Masahisa Iida, Yokohama (JP); Toshihiro Nakamura, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 603 days.

(21) Appl. No.: 17/730,881

(22) Filed: Apr. 27, 2022

(65) Prior Publication Data

US 2022/0254811 A1 Aug. 11, 2022

Related U.S. Application Data

(63) Continuation of application No. PCT/JP2019/043824, filed on Nov. 8, 2019.

(51) Int. Cl.
*H10D 84/90* (2025.01)
*H03K 19/177* (2020.01)

(52) U.S. Cl.
CPC ......... *H10D 84/907* (2025.01); *H03K 19/177* (2013.01); *H10D 84/981* (2025.01); *H10D 84/992* (2025.01)

(58) Field of Classification Search
CPC .. H10D 84/907; H10D 84/981; H10D 84/992; H10D 8/00; H10D 12/01; H02K 15/90; H03K 19/177
See application file for complete search history.

(56) References Cited

U.S. PATENT DOCUMENTS

| | | |
|---|---|---|
| 2001/0035555 A1 | 11/2001 | Nonaka |
| 2002/0000873 A1 | 1/2002 | Tanizaki et al. |
| 2005/0224911 A1 | 10/2005 | Sugano |
| 2007/0230087 A1 | 10/2007 | Komaki |
| 2007/0252217 A1 | 11/2007 | Oki |
| 2008/0135978 A1 | 6/2008 | Furuta |
| 2008/0157124 A1 | 7/2008 | Taniguchi et al. |
| 2009/0140309 A1 | 6/2009 | Katou |
| 2010/0301897 A1* | 12/2010 | Heaton ............ H03K 19/17704 326/38 |

FOREIGN PATENT DOCUMENTS

| | | |
|---|---|---|
| JP | H05-190670 A | 7/1993 |
| JP | 2000-195254 A | 7/2000 |
| JP | 2000-332201 A | 11/2000 |
| JP | 2001-284537 A | 10/2001 |
| JP | 2005-302832 A | 10/2005 |
| JP | 2006-186156 A | 7/2006 |

(Continued)

OTHER PUBLICATIONS

International Search Report (ISR) dated Dec. 24, 2019 issued in International Patent Application No. PCT/JP2019/043824, with English translation.

*Primary Examiner* — Daniel D Chang (74) *Attorney, Agent, or Firm* — Rimon P.C.

(57) ABSTRACT

An IO cell includes a first output transistor and a second output transistor. A capacitance transistor is provided between external connection pads. The capacitance transistor is placed between the output transistors and an edge of the semiconductor integrated circuit device as viewed in plan. The gate length of the capacitance transistor is smaller than the gate length of the output transistors.

16 Claims, 10 Drawing Sheets

(56) References Cited

FOREIGN PATENT DOCUMENTS

| | | | |
|---|---|---|---|
| JP | 2007-273846 | A | 10/2007 |
| JP | 2007-299860 | A | 11/2007 |
| JP | 2008-147338 | A | 6/2008 |
| JP | 2008-166495 | A | 7/2008 |
| JP | 2009-135282 | A | 6/2009 |

* cited by examiner

SEMICONDUCTOR INTEGRATED CIRCUIT DEVICE

CROSS-REFERENCE TO RELATED APPLICATIONS

This is a continuation of International Application No. PCT/JP2019/043824 filed on Nov. 8, 2019. The entire disclosure of this application is incorporated by reference herein.

BACKGROUND

The present disclosure relates to a semiconductor integrated circuit device in which a core region and an IO region are formed.

In recent semiconductor integrated circuit devices, with the increasing speedup, the sizes become finer, and this leads to lower power supply voltages. For this reason, problems such as malfunctions caused by fluctuations in power supply voltages have increased. For control of fluctuations in power supply voltages, it has been widely done to provide a capacitance between power supplies (power supply capacitance) formed of a transistor in a semiconductor integrated circuit device.

In Japanese Unexamined Patent Publication No. 2000-332201 (Patent Document 1), a logical circuit part and a capacitance part are placed adjacent to each other in an IO cell. The layout of the logical circuit part and the capacitance part is facilitated by laying interconnects for the logical circuit part and the capacitance part in a same layer. Also, noise occurring in the logical circuit part is effectively reduced by placing the capacitance part in the vicinity of the logical circuit part.

In Japanese Unexamined Patent Publication No. 2006-186156 (Patent Document 2), a capacitance part is provided between IO cells. It is therefore possible to place a capacitance part near a noise source evenly in the space between IO cells. This capacitance part uses, as its capacitance, channel regions of transistors and overlap capacitances at the sources/drains of the transistors (non-wiring/contact parasitic capacitances).

As the power supply voltages become increasingly lower, however, there arises a problem that the capacitance value of a power supply capacitance formed of a transistor decreases. Neither Patent Document 1 nor 2 mentions improvement in the low-voltage characteristics of the capacitance parts using contact and wiring parasitic capacitances.

An objective of the present disclosure is preventing reduction in the capacitance value of the power supply capacitance when a semiconductor integrated circuit device operates at low voltage.

SUMMARY

According to the first mode of the present disclosure, a semiconductor integrated circuit device includes: a core region in which an internal circuit is formed; and an IO region located between the core region and an edge of the semiconductor integrated circuit device. The IO region including a plurality of IO cells. One of the IO cells includes a first output transistor of a first conductivity type connected to a first external connection pad receiving a first power supply voltage at one end and connected to an output node at the other end, and a second output transistor of a second conductivity type connected to a second external connection pad receiving a second power supply voltage different from the first power supply voltage at one end and connected to the output node at the other end. A capacitance transistor is provided between the first and second external connection pads, and the capacitance transistor is placed between the first and second output transistors and the edge of the semiconductor integrated circuit device as viewed in plan. A gate length of the capacitance transistor is smaller than gate lengths of the first and second output transistors.

According to the above mode, the first output transistor is provided between the first external connection pad receiving the first power supply voltage and the output. The second output transistor is provided between the second external connection pad receiving the second power supply voltage and the output. The capacitance transistor is provided between the first and second external connection pads. The capacitance transistor is placed between the first and second output transistors and an edge of the semiconductor integrated circuit device. The gate length of the capacitance transistor is smaller than the gate lengths of the first and second output transistors. The threshold voltage of the capacitance transistor is therefore lower than the threshold voltages of the first and second output transistors. Thus, in the capacitance transistor, a channel is formed under the gate interconnect even at low voltage, whereby a larger capacitance value is obtained at low voltage. This makes it possible to prevent reduction in the capacitance value of the power supply capacitance when the semiconductor integrated circuit device operates at low voltage.

According to the second mode of the present disclosure, a semiconductor integrated circuit device includes: a core region in which an internal circuit is formed; and an IO region located between the core region and an edge of the semiconductor integrated circuit device. The IO region includes first and second IO cells. The first IO cell includes a first output transistor of a first conductivity type connected to a first external connection pad receiving a first power supply voltage at one end and connected to a first output node at the other end, and a second output transistor of a second conductivity type connected to a second external connection pad receiving a second power supply voltage different from the first power supply voltage at one end and connected to the first output node at the other end. A first capacitance transistor is provided between the first and second external connection pads, the first capacitance transistor is placed between the first and second IO cells, and a gate length of the first capacitance transistor is smaller than a gate length of the first and second output transistors.

According to the above mode, the first output transistor is provided between the first external connection pad receiving the first power supply voltage and the first output. The second output transistor is provided between the second external connection pad receiving the second power supply voltage and the first output. The first capacitance transistor is provided between the first and second external connection pads. The first capacitance transistor is placed between the first and second IO cells. The gate length of the first capacitance transistor is smaller than the gate lengths of the first and second output transistors. The threshold voltage of the first capacitance transistor is therefore lower than the threshold voltages of the first and second output transistors. Thus, in the first capacitance transistor, a channel is formed under the gate interconnect even at low voltage, whereby a larger capacitance value is obtained at low voltage. This makes it possible to prevent reduction in the capacitance value of the power supply capacitance when the semiconductor integrated circuit device operates at low voltage.

According to the present disclosure, it is possible to prevent reduction in the capacitance value of the power supply capacitance when a semiconductor integrated circuit device operates at low voltage.

DETAILED DESCRIPTION

An embodiment of the present disclosure will be described hereinafter with reference to the accompanying drawings.

Embodiment

Figure 1:
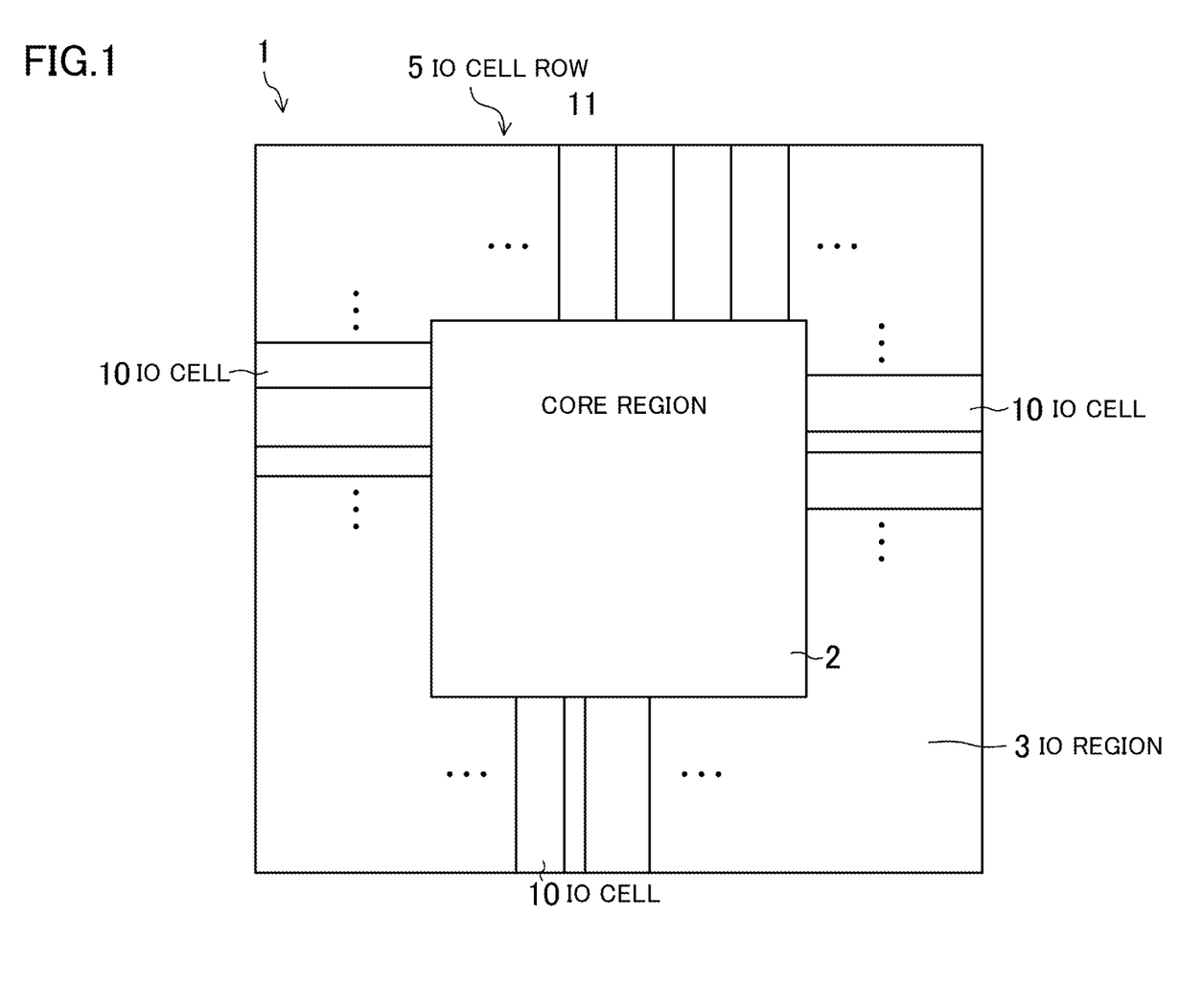
FIG. 1 is a plan view schematically showing the entire configuration of a semiconductor integrated circuit device according to an embodiment.

FIG. 1 is a plan view schematically showing the entire configuration of a semiconductor integrated circuit device according to an embodiment. A semiconductor integrated circuit device 1 shown in FIG. 1 includes a core region 2 in which inner core circuits are formed and an IO region 3, provided to surround the core region 2, in which interface circuits (IO circuits) are formed. In the IO region 3, an IO cell row 5 is provided around the perimeter of the semiconductor integrated circuit device 1. Although illustration is simplified in FIG. 1, the IO cell row 5 includes a plurality of IO cells 10 constituting the interface circuits. Note that a side of the perimeter of the semiconductor integrated circuit device 1 is hereinafter referred to as an edge of the semiconductor integrated circuit device 1 in some cases.

Figure 2:
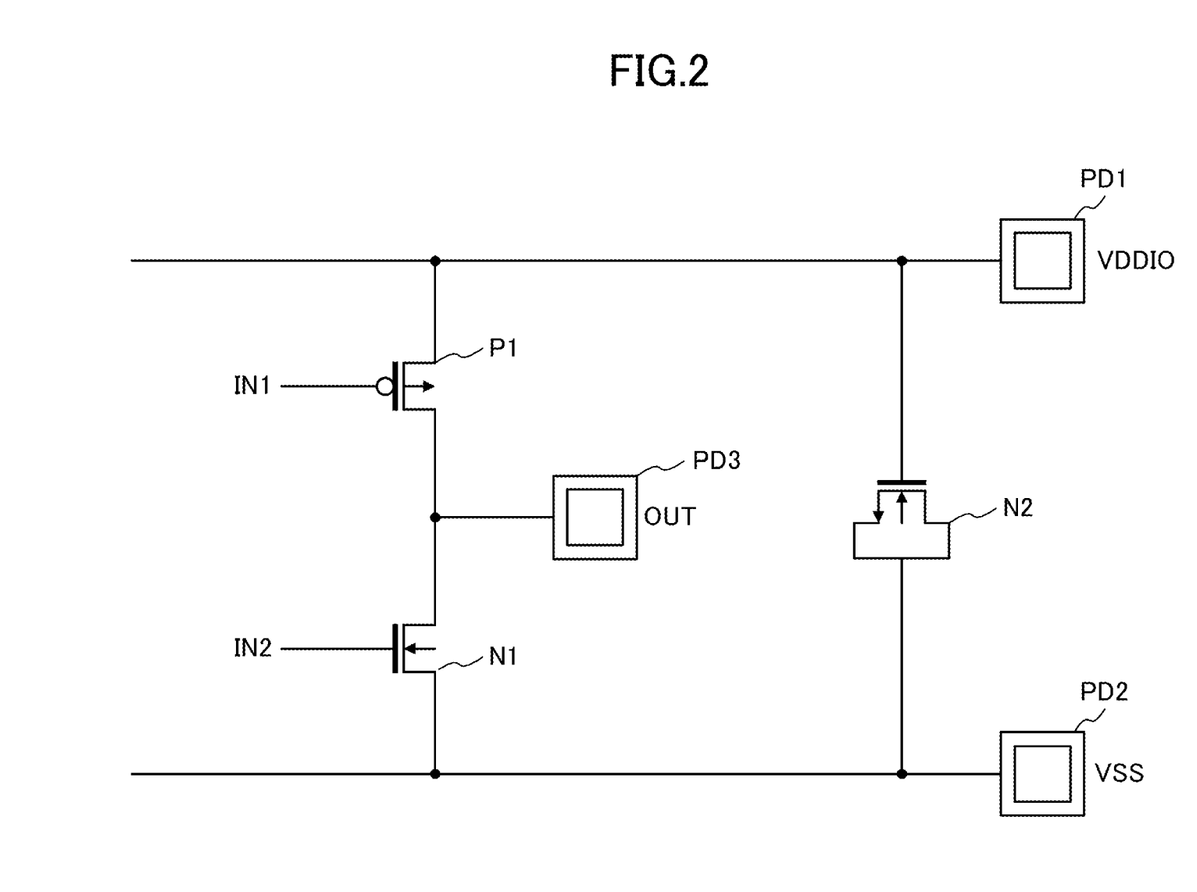
FIG. 2 is a circuit diagram configured in an IO cell according to the embodiment.

FIG. 2 shows a circuit diagram configured in the IO cell according to the embodiment. Each of the IO cells 10 constitutes an IO cell circuit, which includes output transistors P1 and N1 and a capacitance transistor N2. The output transistor P1 is a p-type field effect transistor (FET), and the output transistor N1 and the capacitance transistor N2 are n-type FETs. Note that the IO cell 10 also includes circuits other than the IO cell circuit although illustration of such circuits is omitted.

The output transistor P1 has a source connected to an external connection pad PD1, a drain connected to an external connection pad PD3, and a gate receiving a driving signal IN1. The output transistor N1 has a source connected to an external connection pad PD2, a drain connected to the external connection pad PD3, and a gate receiving a driving signal IN2. The capacitance transistor N2 has a source and a drain both connected to the external connection pad PD2 and a gate connected to the external connection pad PD1. The external connection pad PD1 is connected to a power supply of a power supply voltage VDDIO, the external connection pad PD2 is connected to a power supply of a ground potential (power supply voltage VSS), and the external connection pad PD3 is connected to an output OUT (corresponding to the output node).

That is, the output transistor P1 outputs the power supply voltage VDDIO received at its source to the output OUT according to the driving signal IN1. The output transistor N1 outputs the power supply voltage VSS received at its source to the output OUT according to the driving signal IN2.

In the capacitance transistor N2, with supply of the power supply voltage VDDIO at its gate, a channel is formed, whereby a gate oxide film functions as a capacitance.

Note that each of the output transistors P1 and N1 may be constituted by a plurality of stages of p-type or n-type transistors.

Elements other than transistors may be included in the IO cell 10. For example, resistive elements may be inserted between the source of the output transistor P1 and the external connection pad PD1 and between the source of the output transistor N1 and the external connection pad PD2.

An n-type FET may be inserted between the external connection pads PD1 and PD3 in place of the output transistor P1, and a p-type FET may be inserted between the external connection pads PD2 and PD3 in place of the output transistor N1.

(Configuration of IO Cell)

Figure 3:
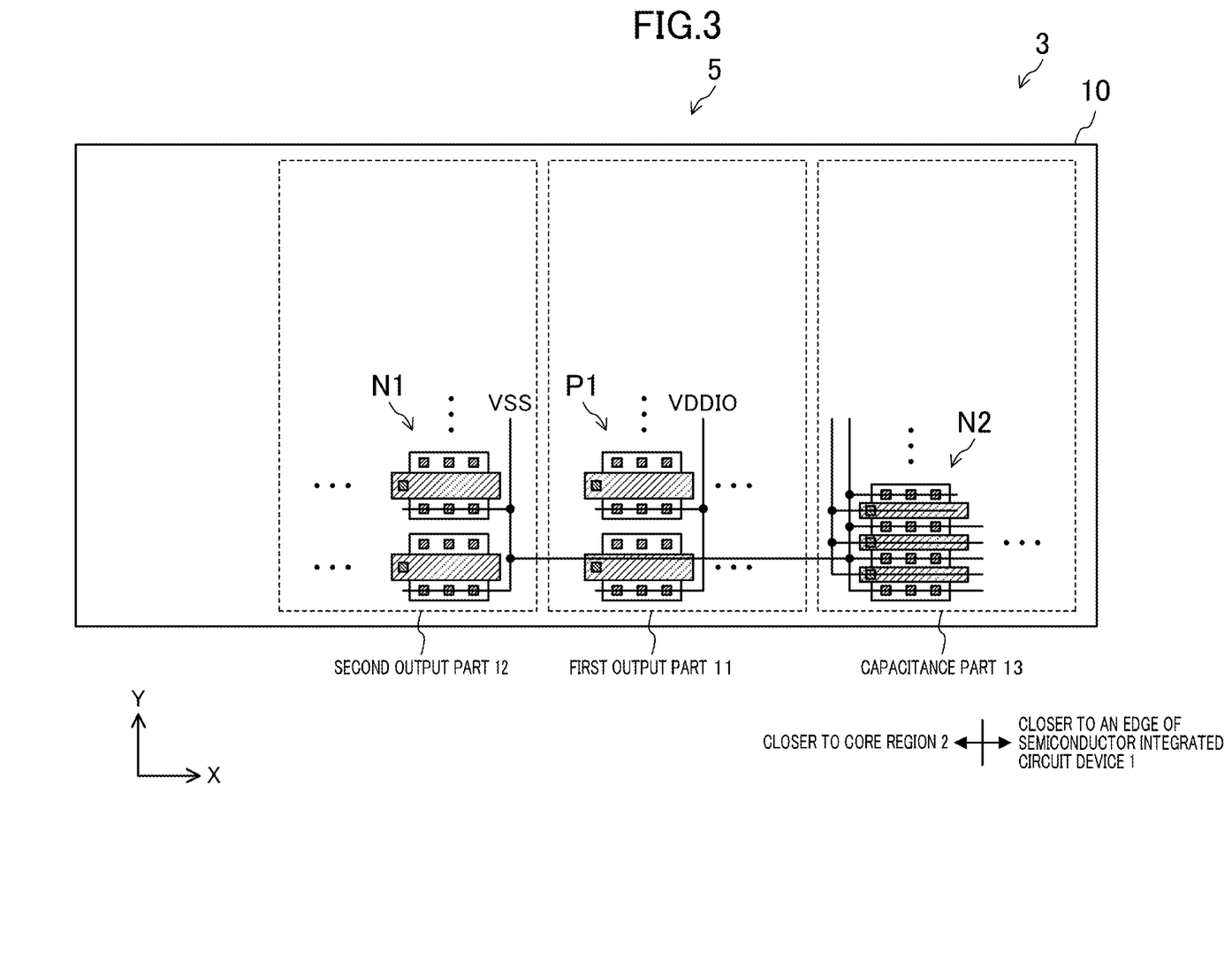
FIG. 3 is a plan view of the IO cell according to the embodiment.

FIG. 3 shows a plan view of the IO cell according to the embodiment. The IO cell 10 includes a first output part 11, a second output part 12, and a capacitance part 13. In the IO cell 10, the first output part 11, the second output part 12, and the capacitance part 13 are placed in line in an X direction (the horizontal direction in the figure, which is a direction vertical to a direction along an edge of the semiconductor integrated circuit device 1 and corresponds to the fourth direction). The second output part 12 is located on the side of the first output part 11 closer to the core region 2 in the X direction. The capacitance part 13 is located on the side of the first output part 11 closer to an edge of the semiconductor integrated circuit device 1 in the X direction, and at the right end of the IO cell 10 in the figure.

As shown in FIG. 3, a plurality of output transistors P1, a plurality of output transistors N1, and a plurality of capacitance transistors N2 are placed in the first output part 11, the second output part 12, and the capacitance part 13, respectively. Specifically, in the first output part 11, a plurality of output transistors P1 are arranged in the X direction and also in a Y direction (the vertical direction in the figure, which is a direction along an edge of the semiconductor integrated circuit device 1 and corresponds to the third direction). In the second output part 12, a plurality of output transistors N1 are arranged in the X and Y directions. In the capacitance part 13, a plurality of capacitance transistors N2 are arranged in the X and Y directions. The plurality of output transistors P1 in the first output part 11 are connected in parallel, the plurality of output transistors N1 in the second output part 12 are connected in parallel, and the plurality of capacitance transistors N2 in the capacitance part 13 are connected in parallel.

Although illustration is omitted, the external connection pads PD1 to PD3 are formed above the IO cell 10.

While the second output part 12 is placed on the left side of the first output part 11 in FIG. 3, the second output part 12 may be placed on the right side of the first output part 11. Otherwise, the first output part 11 and the second output part 12 may be placed side by side in the Y direction.

While the first output part 11, the second output part 12, and the capacitance part 13 are placed adjacent to one another in the X direction, such adjacent placement is not necessarily required. For example, an electrostatic discharge (ESD) protection circuit and a resistive element may be provided between the first output part 11 and the second output part 12. Note however that placement of the capacitance part 13 adjacent to either one of the first output part 11 and the second output part 12 will enhance an effect of controlling the power supply voltages.

While the IO cell 10 is configured to include the capacitance part 13 (the capacitance transistors N2), it is not necessarily required to include the capacitance part 13. In this case, the capacitance part 13 is to be placed on the side of the IO cell 10 closer to an edge of the semiconductor integrated circuit device 1 (on the right side of the IO cell 10 in the figure).

Figure 4:
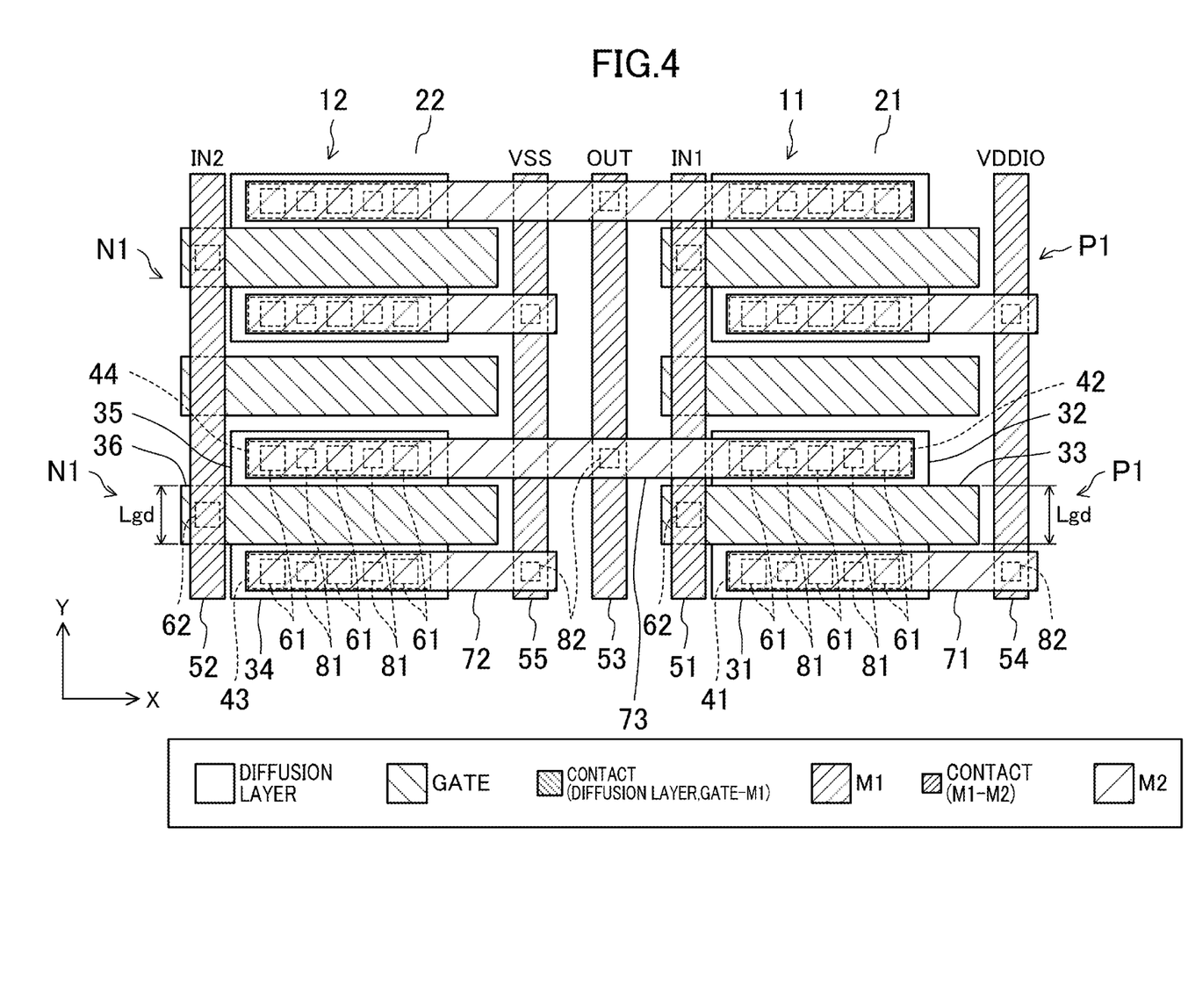
FIG. 4 is a plan view of first and second output parts according to the embodiment.

FIG. 4 shows a plan view of the first output part and the second output part. As shown in FIG. 4, an N-well region 21 is formed on the right and a P-well region 22 is formed on the left, as viewed in the figure.

In the N-well region 21, diffusion regions 31 and 32 including a p-type semiconductor are formed to extend in the X direction. A gate interconnect 33 extending in the X direction is formed over a channel region between the diffusion regions 31 and 32 through a gate oxide film not shown. The diffusion region 31 provided on the lower side of the gate interconnect 33 in the figure serves as the source of the output transistor P1, the diffusion region 32 provided on the upper side of the gate interconnect 33 in the figure serves as the drain of the output transistor P1, and the gate interconnect 33 serves as the gate of the output transistor P1. The diffusion region 31 is hereinafter referred to as the source 31 of the output transistor P1, and the diffusion region 33 as the drain 32 of the output transistor P1.

In the P-well region 22, diffusion regions 34 and 35 including an n-type semiconductor are formed to extend in the X direction. A gate interconnect 36 extending in the X direction is formed over a channel region between the diffusion regions 34 and 35 through a gate oxide film not shown. The diffusion region 34 provided on the lower side of the gate interconnect 36 in the figure serves as the source of the output transistor N1, the diffusion region 35 provided on the upper side of the gate interconnect 36 in the figure serves as the drain of the output transistor N1, and the gate interconnect 36 serves as the gate of the output transistor N1. The diffusion region 34 is hereinafter referred to as the source 34 of the output transistor N1, and the diffusion region 35 as the drain 35 of the output transistor N1.

The gate interconnects 33 and 36 are formed to have the same length Lgd in the Y direction. This indicates that the output transistors P1 and N1 have the same gate length Lgd.

Interconnects 41 to 44 extending in the X direction and interconnects 51 to 55 extending in the Y direction are formed in an M1 wiring layer above the output transistors P1 and N1. The interconnect 41 is connected with the source 31 through contacts 61, the interconnect 42 is connected with the drain 32 through contacts 61, the interconnect 43 is connected with the source 34 through contacts 61, and the interconnect 44 is connected with the drain 35 through contacts 61. The interconnect 51 is connected with the gate interconnect 33 through a contact 62, and the interconnect 52 is connected with the gate interconnect 36 through a contact 62. The interconnects 51 and 52 are interconnects receiving the driving signals IN1 and IN2, respectively, and the interconnect 53 corresponds to the output OUT. The interconnects 54 and 55 correspond to lines supplying the power supply voltages VDDIO and VSS, respectively.

Interconnects 71 to 73 extending in the X direction are formed in an M2 wiring layer above the M1 wiring layer. The interconnect 71 is connected with the interconnect 41 through contacts 81 and connected with the interconnect 54 through a contact 82. The interconnect 72 is connected with the interconnect 43 through contacts 81 and connected with the interconnect 55 through a contact 82. The interconnect 73 is connected with the interconnects 42 and 44 through contacts 81 and connected with the interconnect 53 through a contact 82.

That is, in the output transistor P1, the source 31 receives the power supply voltage VDDIO through the contacts 61, the interconnect 41, the contacts 81, the interconnect 71, the contact 82, and the interconnect 54, and the drain 32 is connected with the output OUT through the contacts 61, the interconnect 42, the contacts 81, the interconnect 73, the contact 82, and the interconnect 53. In the output transistor N1, the source 34 receives the power supply voltage VSS through the contacts 61, the interconnect 43, the contacts 81, the interconnect 72, the contact 82, and the interconnect 55, and the drain 35 is connected with the output OUT through the contacts 61, the interconnect 44, the contacts 81, the interconnect 73, the contact 82, and the interconnect 53.

Figure 5:
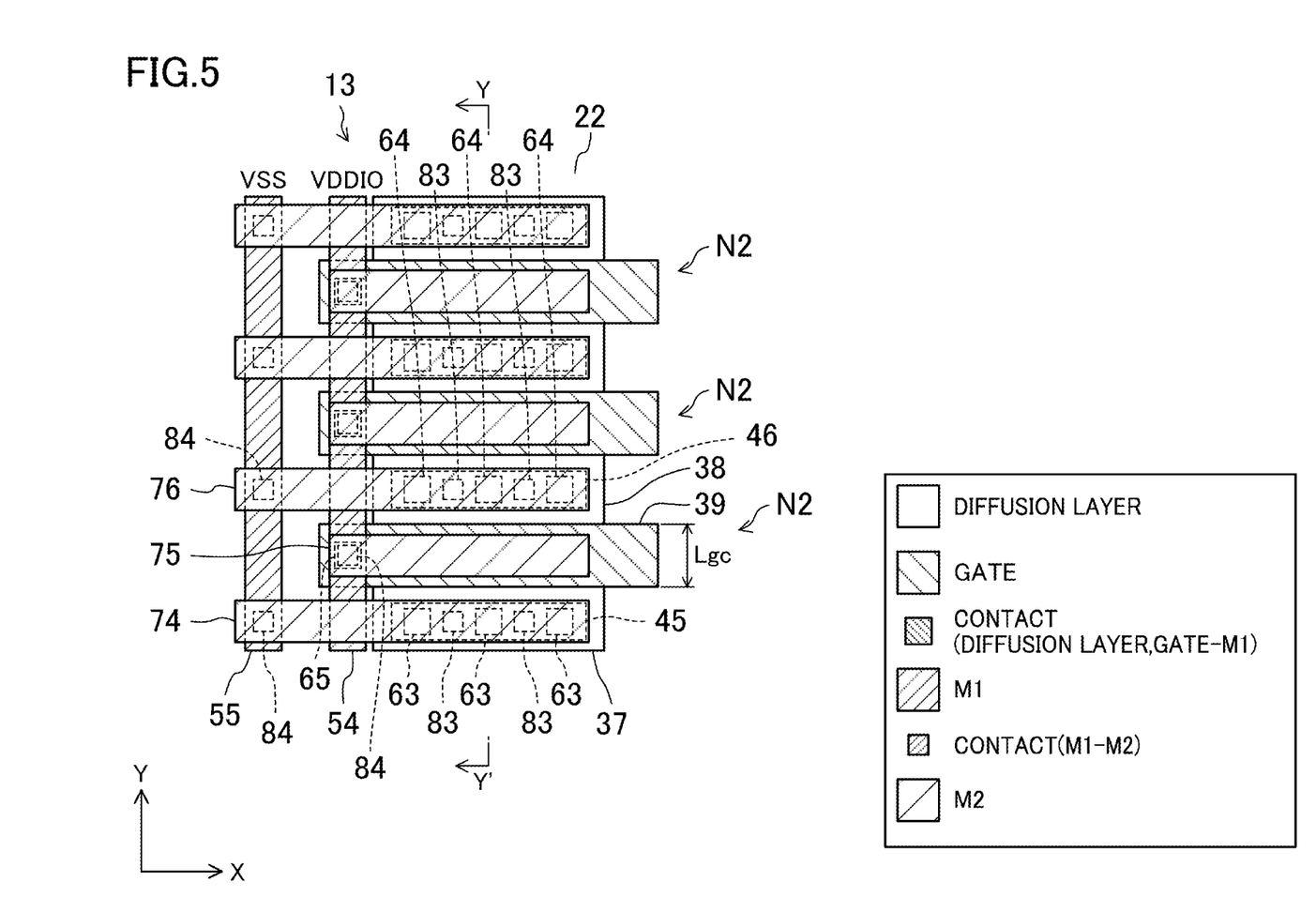
FIG. 5 is a plan view of a capacitance part according to the embodiment.
Figure 6:
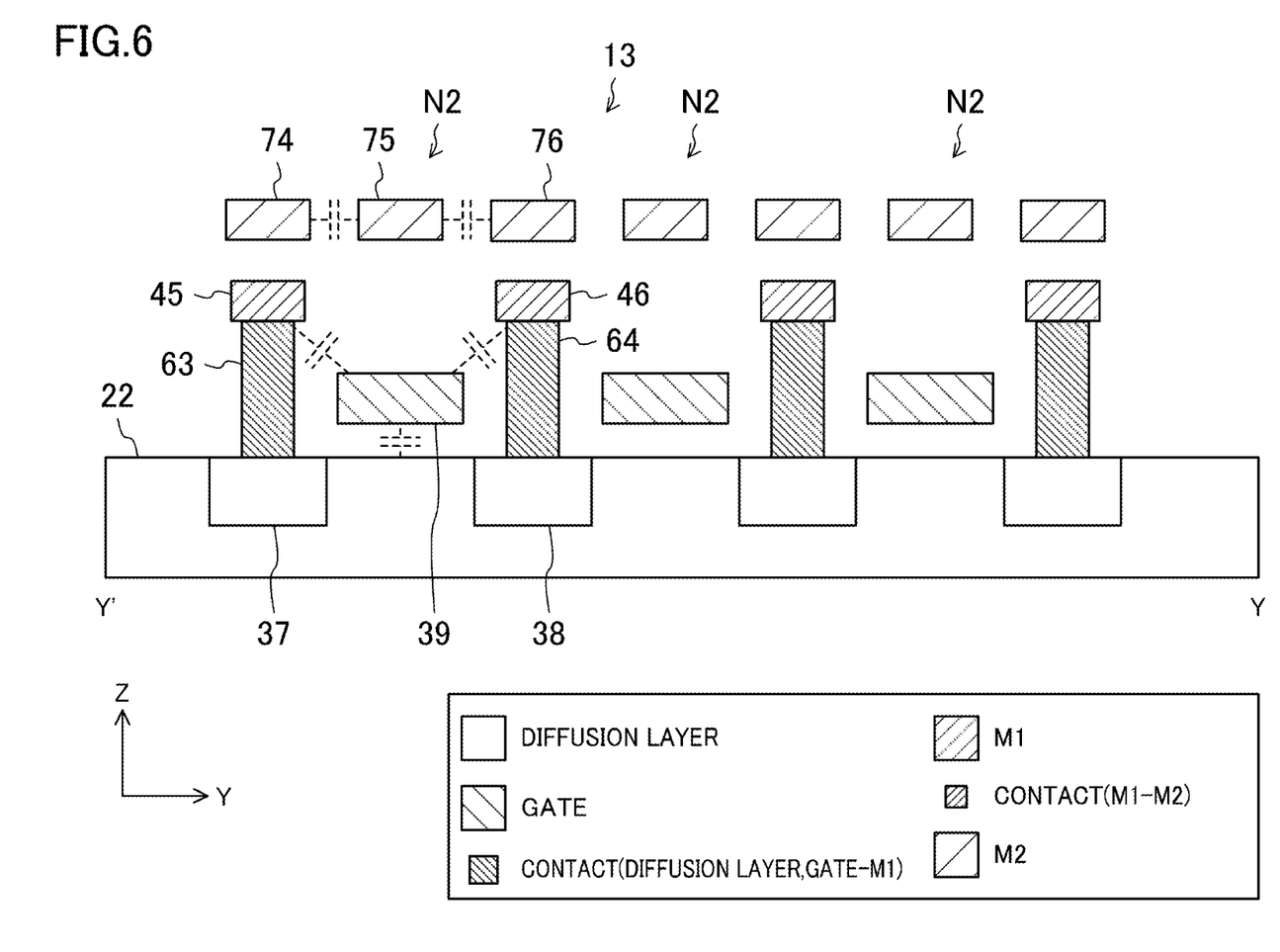
FIG. 6 is a cross-sectional view of the capacitance part according to the embodiment.

FIG. 5 shows a plan view of the capacitance part, and FIG. 6 shows a cross-sectional view of the capacitance part. Specifically, FIG. 6 shows a cross section taken along line Y-Y' in FIG. 5. In the capacitance part 13, the capacitance transistors N2 are placed adjacently in the Y direction. Such capacitance transistors N2 adjacent to each other in the Y direction share a diffusion region formed between their gate interconnects.

As shown in FIG. 5, diffusion regions 37 and 38 including an n-type semiconductor are formed in the P-well region 22 to extend in the X direction. A gate interconnect 39 extending in the X direction is formed over a channel region between the diffusion regions 37 and 38 through a gate oxide film not shown. The diffusion region 37 provided on the lower side of the gate interconnect 39 in the figure serves as one of the source and drain of the capacitance transistor N2, the diffusion region 38 provided on the upper side of the gate interconnect 39 in the figure serves as the other of the source and drain of the capacitance transistor N2, and the gate interconnect 39 serves as the gate of the capacitance transistor N2. For the sake of convenience, the diffusion region 37 is hereinafter referred to as the source 37 of the capacitance transistor N2, and the diffusion region 38 as the drain 38 of the capacitance transistor N2.

Interconnects 45 and 46 extending in the X direction are formed in the M1 wiring layer. The interconnect 45 is connected with the source 37 through contacts 63, and the interconnect 46 is connected with the drain 38 through contacts 64. The interconnect 54 is connected with the gate interconnect 39 through a contact 65.

Interconnects 74 to 76 extending in the X direction are formed in the M2 wiring layer. The interconnect 74 is connected with the interconnect 45 through contacts 83 and connected with the interconnect 55 through a contact 84. The interconnect 75 is connected with the interconnect 54 through a contact 84. The interconnect 76 is connected with the interconnect 46 through contacts 83 and connected with the interconnect 55 through a contact 84.

That is, in the capacitance transistor N2, the source 37 receives the power supply voltage VSS through the contacts 63, the interconnect 45, the contacts 83, the interconnect 74, the contact 84, and the interconnect 55, the drain 38 receives the power supply voltage VSS through the contacts 64, the interconnect 46, the contacts 83, the interconnect 76, the contact 84, and the interconnect 55, and the gate interconnect 39 receives the power supply voltage VDDIO through the contact 65 and the interconnect 54. With this configuration, a channel region is formed between the source 37 and the drain 38, thereby producing a capacitance between the power supply voltages VDDIO and VSS through the gate oxide film.

Also, as shown in FIG. 6, overlap/fringe capacitances are produced between the gate interconnect 39 and the contact 63 and between the gate interconnect 39 and the contact 64. Moreover, wiring capacitances are produced between the interconnect 75 and the interconnect 74 and between the interconnect 75 and the interconnect 76.

The length Lgc of the gate interconnect 39 of the capacitance transistor N2 in the Y direction is made shorter than the length Lgd of the gate interconnects 33 and 36 of the output transistors P1 and N1 in the Y direction. That is, the gate length Lgc of the capacitance transistor N2 is shorter than the gate length Lgd of the output transistors P1 and N1.

Figure 7:
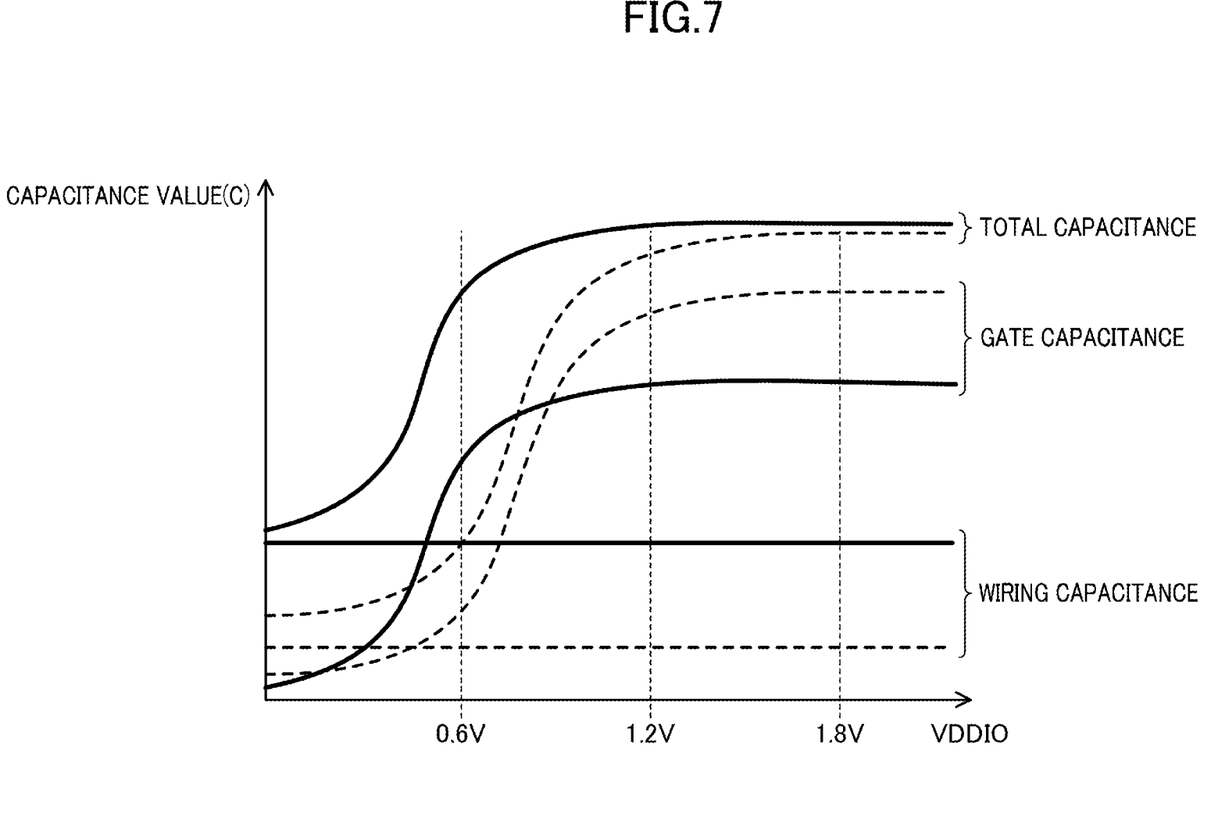
FIG. 7 is a graph comparing the capacitance value between the capacitance part according to the embodiment and a conventional capacitance part.

FIG. 7 is a graph comparing the capacitance values between the capacitance part according to this embodiment and a conventional capacitance part. In FIG. 7, the solid lines represent the capacitance values of the capacitance part 13 according to this embodiment and the dashed lines represent the capacitance values of a conventional capacitance part. As shown in FIG. 7, during operation at low voltage (e.g., around 0.6 V), the capacitance values (C) are higher in the capacitance part according to this embodiment than in the conventional capacitance part.

In the output transistors P1 and N1, the gate length Lgd needs to be a fixed length or larger to control an increase in leak current caused by application of a high voltage between the source and the drain and also to control degradation in hot carriers. By contrast, in the capacitance transistor N2, since the voltages supplied to the source and the drain are at the same potential, the gate length Lgc can be smaller than the gate length Lgd.

In the capacitance transistor N2, when the power supply voltage VDDIO applied to the gate interconnect 39 exceeds the threshold voltage of the transistor, the capacitance value (corresponding to the gate capacitance in FIG. 7) increases due to the channel formed under the gate interconnect 39. In the conventional capacitance part, in order to increase the capacitance value per unit area, the gate length Lgc of the capacitance transistor N2 is made as large as possible to increase the gate area per unit area. However, when the power supply voltage VDDIO is low (e.g., when it is 0.6 V or less), the channel formed under the gate interconnect 39 is insufficient, failing to obtain a sufficient capacitance value.

In this embodiment, therefore, the gate length Lgc of the capacitance transistor N2 is made smaller than the gate length Lgd of the output transistors P1 and N1. Since this reduces the gate area per unit area, the threshold voltage of the capacitance transistor N2 decreases. Thus, a channel region is formed under the gate interconnect even at low voltage, whereby a larger capacitance value is obtained at low voltage.

In particular, when the power supply voltage VDDIO is lower, problems such as malfunctions caused by fluctuations in power supply voltages occur more easily. In view of this, the capacitance transistor N2 (capacitance part 13) according to this embodiment, which can obtain a large capacitance value in a low-voltage range, is effective in controlling fluctuations in power supply voltages at low voltage.

Moreover, the interconnects 45 and 46 are provided above the source 37 and drain 38, respectively, of the capacitance transistor N2 in the M1 wiring layer. Also, the interconnects 74 to 76 are provided above the source 37, drain 38, and gate interconnect 39 of the capacitance transistor N2 in the M2 wiring layer. With this configuration, wiring capacitances (corresponding to the wiring capacitance in FIG. 7) can be produced above the source 37, drain 38, and gate interconnect 39 of the capacitance transistor N2.

By reducing the gate length Lgc of the capacitance transistor N2, the number of interconnects laid per unit area becomes large, increasing the wiring capacitance per unit area when the distance between interconnects is fixed. Therefore, the total capacitance value obtained by adding the wiring capacitance to the gate capacitance also becomes larger when the gate length Lgc of the capacitance transistor N2 is made smaller, over a wide voltage range. The capacitance transistor N2 is therefore more effective in controlling fluctuations in power supply voltages.

With the above configuration, the IO region 3 is placed between the core region 2 in which internal circuits are formed and an edge of the semiconductor integrated circuit device 1. The IO region 3 includes a plurality of IO cells 10. One of the IO cells 10 includes: the output transistor P1 having the source 31 connected to the external connection pad PD1 receiving the power supply VDDIO and the drain 32 connected to the output OUT; and the output transistor N1 having the source 34 connected to the external connection pad PD2 receiving the power supply VSS and the drain 35 connected to the output OUT. The capacitance transistor N2 is provided between the external connection pads PD1 and PD2. The capacitance part 13 (capacitance transistor N2) is placed between the first and second output parts 11 and 12 (output transistors P1 and N1) and an edge of the semiconductor integrated circuit device 1. The gate length Lgc of the capacitance transistor N2 is smaller than the gate length Lgd of the output transistors P1 and N1. The threshold voltage of the capacitance transistor N2 is therefore lower than the threshold voltages of the output transistors P1 and N1. Thus, in the capacitance transistor, a channel is formed under the gate interconnect even at low voltage, whereby a larger capacitance value is obtained at low voltage. This makes it possible to prevent reduction in the capacitance value of the power supply capacitance when the semiconductor integrated circuit device operates at low voltage.

Also, the source 37 and drain 38 of the capacitance transistor N2 extend in the X direction. Above the source 37 and the drain 38, formed are the interconnect 45 extending in the X direction and overlapping the source 37 as viewed in plan and the interconnect 46 extending in the X direction and overlapping the drain 38 as viewed in plan. The interconnects 45 and 46 are connected with the source 37 and the drain 38 through the contacts 63 and 64, respectively. This produces overlap/fringe capacitances between the gate interconnect 39 and the contact 63 and between the gate interconnect 39 and the contact 64. It is therefore possible to increase the capacitance value of the power supply capacitance.

Moreover, the interconnects 74 to 76 are provided above the source 37, drain 38, and gate interconnect 39 of the capacitance transistor N2. This can produce wiring capacitances above the source 37, drain 38, and gate interconnect

39 of the capacitance transistor N2. It is therefore possible to increase the capacitance value of the power supply capacitance.

(Alteration of Capacitance Part)

Figure 8A:
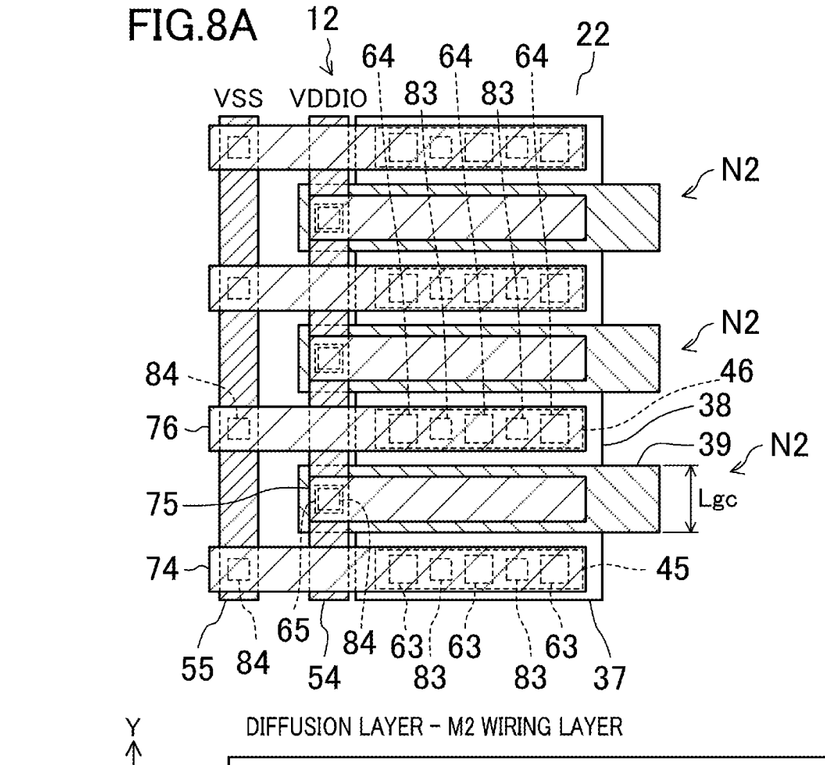
FIGS. 8A-8B are plan views showing a capacitance part according to an alteration.
Figure 8B:
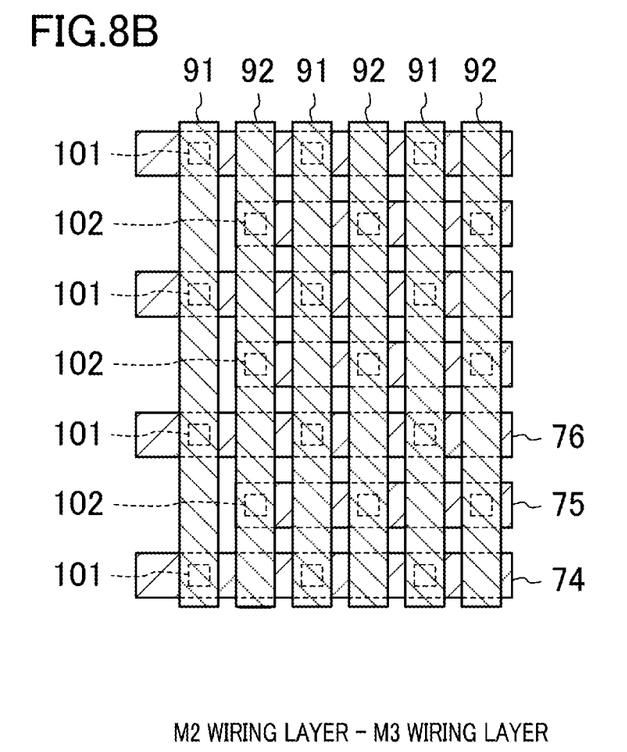

FIGS. 8A-8B are plan views showing a capacitance part according to an alteration of the embodiment, in which FIG. 8A shows a layout structure of the diffusion layer to the M2 wiring layer of the capacitance part, and FIG. 8B shows a layout structure of the M2 wiring layer to an M3 wiring layer of the capacitance part.

In FIGS. 8A-8B, in comparison with FIG. 5, interconnects 91 and 92 for connecting the interconnects formed in the M2 wiring layer are formed in the M3 wiring layer located above the M2 wiring layer.

Specifically, in the M3 wiring layer, the interconnects 91 and 92 extending in the Y direction are formed. Each interconnect 91 is connected with a plurality of interconnects 74 and a plurality of interconnects 76 through contacts 101, and each interconnect 92 is connected with a plurality of interconnects 75 through contacts 102.

With the formation of the interconnects 91 and 92 extending in the Y direction in the M3 wiring layer, the wiring capacitance can be further increased.

Note that interconnects extending in the X direction can be formed in the M3 wiring layer. In this case, such interconnects in the M3 wiring layer will be formed to be connected with the interconnects 74, 75, or 76.

The interconnects 91 and 92 may be formed in a layer above the M3 wiring layer.

(Other Layout Structure 1 of Semiconductor Integrated Circuit Device)

Figure 9:
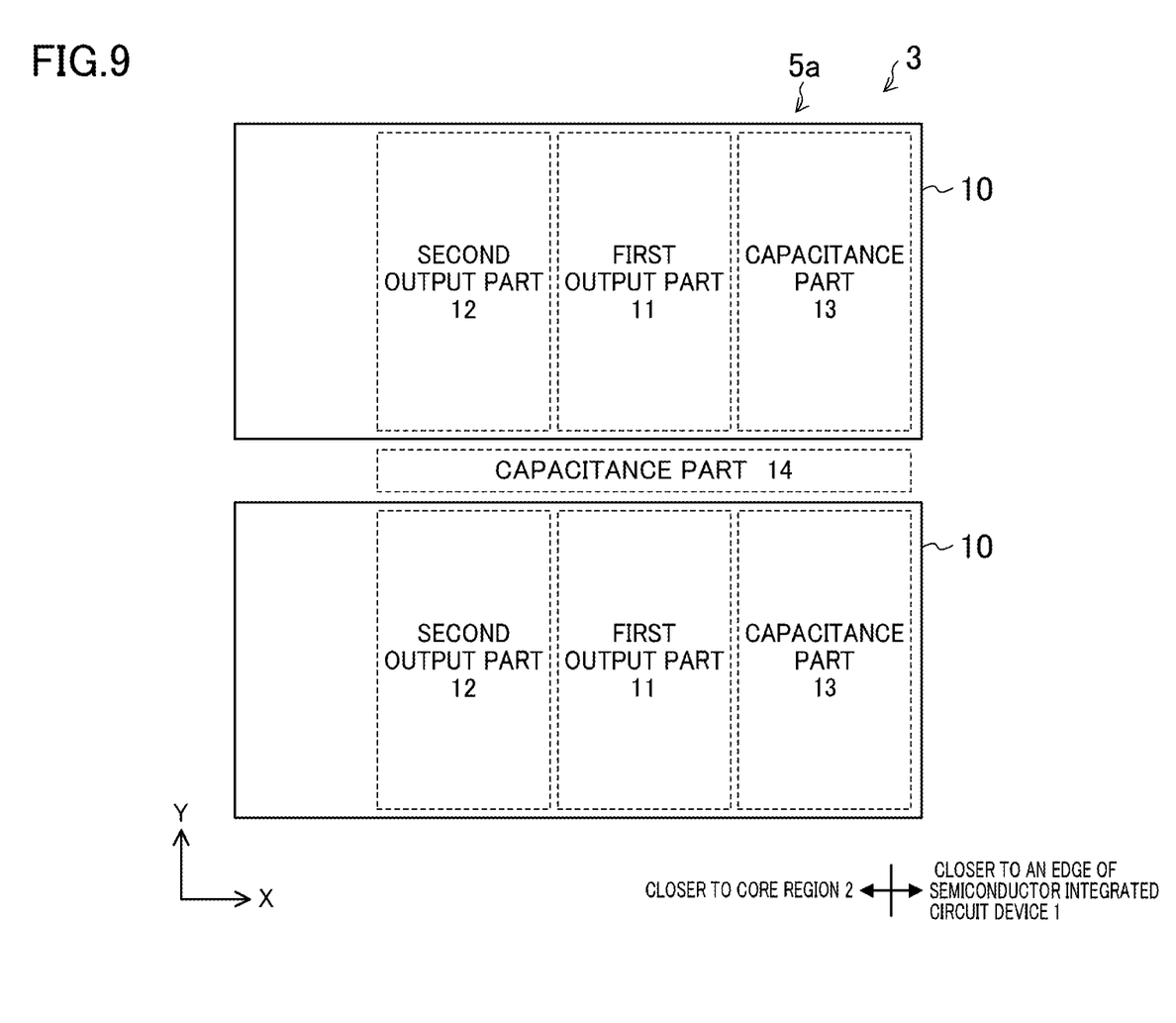
FIG. 9 is a plan view showing another layout structure of the semiconductor integrated circuit device according to the embodiment.

FIG. 9 is a plan view showing another layout structure of the semiconductor integrated circuit device. In FIG. 9, in comparison with FIG. 3, an IO cell row 5a including IO cells placed adjacent to each other in the Y direction is provided in the IO region 3. The IO cell row 5a includes a capacitance part 14 formed to extend in the X direction between the IO cells 10. Although illustration is omitted, the capacitance part 14 includes a plurality of capacitance transistors N2.

As shown in FIG. 9, in each IO cell 10, the capacitance part 13 is formed at the right end in the figure.

In FIG. 9, the capacitance part 14 is formed over the regions between the second output parts 12, between the first output parts 11, and between the capacitance parts 13. In general, interconnects connected in common to the first output parts 11 and the second output parts 12 are laid in the space between the adjacent IO cells 10. For this reason, it is difficult to provide wiring capacitances in the regions between the first output parts 11 and between the second output parts 12 in the space between the IO cells 10. Therefore, by providing the capacitance part 14 in the region between the capacitance parts 13, it becomes easier to provide wiring capacitances in the space between the IO cells 10.

Note that it is not necessarily required to form the capacitance part 14 between the IO cells 10 or form the capacitance part 13 in each IO cell 10.

(Other Layout Structures 2 of Semiconductor Integrated Circuit Device)

Figure 10A:
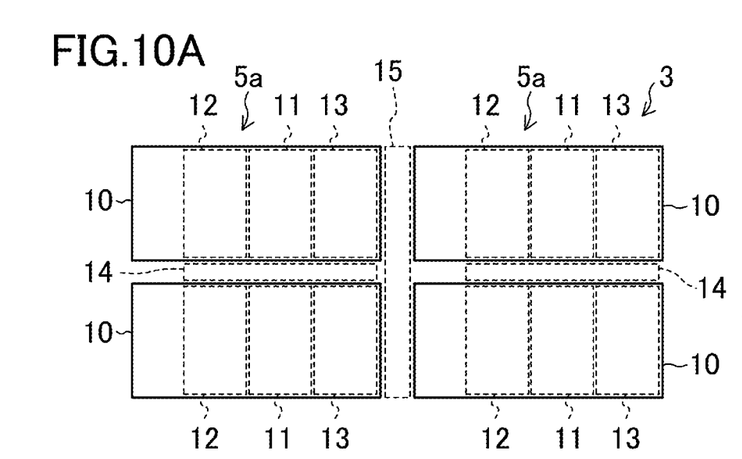
FIGS. 10A-10C are plan views showing other layout structures of the semiconductor integrated circuit device according to the embodiment.
Figure 10B:
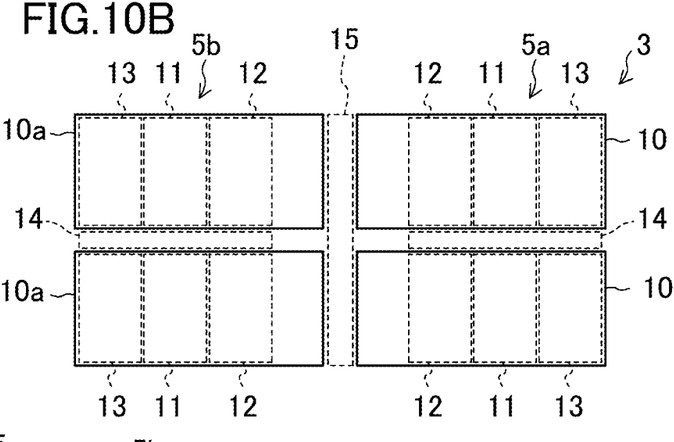
Figure 10C:
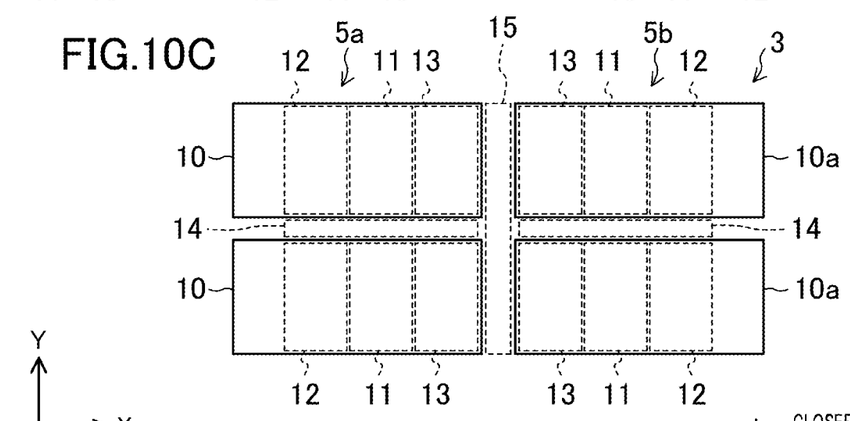

FIGS. 10A-10C are plan views showing other layout structures of the semiconductor integrated circuit device. In each of FIGS. 10A-10C, two IO cell rows each including IO cells placed side by side in the Y direction are arranged in the X direction in the IO region 3. The capacitance part 14 is formed between the IO cells adjacent to each other in the Y direction, and a capacitance part 15 is formed between the IO cell rows. Although illustration is omitted, the capacitance part 15 includes a plurality of capacitance transistors N2. In an IO cell row 5b, IO cells 10a, inverted from the IO cells 10 in the X direction, are placed side by side in the Y direction.

In FIG. 10A, the IO cell rows 5a including the IO cells 10 are placed on the left (the side closer to the core region 2) and on the right (the side closer to an edge of the semiconductor integrated circuit device 1), as viewed in the figure.

In FIG. 10B, the IO cell row 5b including the IO cells 10a is placed on the left, and the IO cell row 5a including the IO cells 10 is placed on the right, as viewed in the figure.

In FIG. 10C, the IO cell row 5a including the IO cells 10 is placed on the left, and the IO cell row 5b including the IO cells 10a is placed on the right, as viewed in the figure. In this placement, since the capacitance parts 13 of the IO cells 10 and 10a and the capacitance parts 14 and 15 are close to one another, the effect of controlling the power supply voltages enhances.

While two IO cell rows are placed side by side in the X direction in the IO region 3 in FIGS. 10A-10C, more than two cell rows may be placed in line in the X direction in the IO region 3.

In the embodiment and alterations described above, while the IO cell row 5 is provided around the perimeter of the semiconductor integrated circuit device 1, the placement is not limited to this. For example, the IO cell row 5 may be provided along a portion of the perimeter of the semiconductor integrated circuit device 1. Also, it is not necessarily required to apply the configuration of this embodiment to the entire of the IO cell row 5, but is only required to apply it to a part thereof.

While the gate interconnects 33 and 36 of the output transistors P1 and N1 have the same length Lgd in the Y direction (gate lengths Lgd) in the embodiment and the alterations described above, the configuration is not limited to this. It is only required that the length Lgc in the Y direction (gate length Lgc) of the gate interconnect 39 of the capacitance transistor N2 should be smaller than any of the lengths in the Y direction of the gate interconnects 33 and 36.

While it is described in the embodiment and the alterations that the direction vertical to the direction in which the source 37 and drain 38 of the capacitance transistor N2 extend (corresponding to the second direction) and the direction along an edge of the semiconductor integrated circuit device 1 (corresponding to the third direction) are the same, and the direction in which the source 37 and drain 38 of the capacitance transistor N2 extend (corresponding to the first direction) and the direction vertical to the direction along an edge of the semiconductor integrated circuit device 1 (corresponding to the fourth direction) are the same, the configuration is not limited to this. For example, when the orientation of the transistors is changed 90 degrees, the first direction and the third direction will be the same, and the second direction and the fourth direction will be the same.

According to the present disclosure, in a semiconductor integrated circuit device provided with IO cells, it is possible to prevent reduction in the capacitance value of the power supply capacitance when the device operates at low voltage.

What is claimed is:

1. A semiconductor integrated circuit device, comprising:
   a core region in which an internal circuit is formed; and
   an IO region located between the core region and an edge of the semiconductor integrated circuit device, the IO region including a plurality of IO cells,
   wherein
   one of the IO cells includes a first output transistor of a first conductivity type connected to a first external connection pad receiving a first power supply voltage at one end and connected to an output node at the other end, and a second output transistor of a second conductivity type connected to a second external connection pad receiving a second power supply voltage different from the first power supply voltage at one end and connected to the output node at the other end, a capacitance transistor is provided between the first and second external connection pads, the capacitance transistor is placed between the first and second output transistors and the edge of the semiconductor integrated circuit device as viewed in plan, and a gate length of the capacitance transistor is smaller than gate lengths of the first and second output transistors.

2. The semiconductor integrated circuit device of claim 1, wherein a source and drain of the capacitance transistor extend in a first direction, in a layer above the source and drain of the capacitance transistor, formed are a first interconnect extending in the first direction, overlapping the source of the capacitance transistor as viewed in plan, and a second interconnect extending in the first direction, overlapping the drain of the capacitance transistor as viewed in plan, and the first and second interconnects are connected with the source and drain of the capacitance transistor through first and second contacts, respectively.

3. The semiconductor integrated circuit device of claim 2, wherein a gate of the capacitance transistor extends in the first direction, and in a layer above the first and second interconnects, formed are a third interconnect extending in the first direction, overlapping the first interconnect as viewed in plan and connected with the first interconnect, a fourth interconnect extending in the first direction, overlapping the second interconnect as viewed in plan and connected with the second interconnect, and a fifth interconnect extending in the first direction, overlapping the gate of the capacitance transistor as viewed in plan and connected with the gate of the capacitance transistor.

4. The semiconductor integrated circuit device of claim 3, wherein in a layer above the third to fifth interconnects, formed are a sixth interconnect extending in a second direction vertical to the first direction, connected with the third and fourth interconnects, and a seventh interconnect extending in the second direction, connected with the fifth interconnect.

5. The semiconductor integrated circuit device of claim 1, wherein the first and second output transistors and the capacitance transistor are placed in line in a fourth direction vertical to a third direction as viewed in plan, the third direction being a direction along the edge of the semiconductor integrated circuit device.

6. The semiconductor integrated circuit device of claim 5, wherein the second output transistor is placed on a side of the first output transistor closer to the core region in the fourth direction as viewed in plan, and the capacitance transistor is placed on a side of the first output transistor closer to the edge of the semiconductor integrated circuit device in the fourth direction as viewed in plan.

7. The semiconductor integrated circuit device of claim 1, wherein the first power supply voltage is a voltage higher than the second power supply voltage, the first output transistor is a p-type transistor, and the second output transistor is an n-type transistor.

8. The semiconductor integrated circuit device of claim 1, wherein the capacitance transistor is an n-type transistor having a gate connected to the first external connection pad and a source and a drain connected to the second external connection pad.

9. A semiconductor integrated circuit device, comprising:

a core region in which an internal circuit is formed; and an IO region located between the core region and an edge of the semiconductor integrated circuit device, the IO region including first and second IO cells, wherein the first IO cell includes a first output transistor of a first conductivity type connected to a first external connection pad receiving a first power supply voltage at one end and connected to a first output node at the other end, and a second output transistor of a second conductivity type connected to a second external connection pad receiving a second power supply voltage different from the first power supply voltage at one end and connected to the first output node at the other end, a first capacitance transistor is provided between the first and second external connection pads, the first capacitance transistor is placed between the first and second IO cells, and a gate length of the first capacitance transistor is smaller than a gate length of the first and second output transistors.

10. The semiconductor integrated circuit device of claim 9, wherein the first and second IO cells are placed adjacent to each other in a third direction that is a direction along the edge of the semiconductor integrated circuit device as viewed in plan.

11. The semiconductor integrated circuit device of claim 10, wherein the first IO cell further includes a second capacitance transistor provided between the first and second external connection pads, the second IO cell includes a third output transistor of the first conductivity type connected to the first external connection pad at one end and connected to a second output node at the other end, a fourth output transistor of the second conductivity type connected to the second external connection pad at one end and connected to the second output node at the other end, and a third capacitance transistor provided between the first and second external connection pads, and the second and third capacitance transistors are placed at ends of the first and second IO cells, respectively, closer to the edge of the semiconductor integrated circuit device in a fourth direction vertical to the third direction as viewed in plan.

12. The semiconductor integrated circuit device of claim 9, wherein
the first and second IO cells are placed adjacent to each other in a fourth direction vertical to a third direction as viewed in plan, the third direction being a direction along the edge of the semiconductor integrated circuit device.

13. The semiconductor integrated circuit device of claim 12, wherein
the first IO cell further includes
a second capacitance transistor provided between the first and second external connection pads,
the second IO cell includes
a third output transistor of the first conductivity type connected to the first external connection pad at one end and connected to a second output node at the other end,
a fourth output transistor of the second conductivity type connected to the second external connection pad at one end and connected to the second output node at the other end, and
a third capacitance transistor provided between the first and second external connection pads.

14. The semiconductor integrated circuit device of claim 13, wherein
the second and third capacitance transistors are placed at ends of the first and second IO cells, respectively, closer to the edge of the semiconductor integrated circuit device in the fourth direction as viewed in plan.

15. The semiconductor integrated circuit device of claim 13, wherein
the second capacitance transistor is placed at an end of the first IO cell closer to the core region in the fourth direction as viewed in plan, and
the third capacitance transistor is placed at an end of the second IO cell closer to the edge of the semiconductor integrated circuit device in the fourth direction as viewed in plan.

16. The semiconductor integrated circuit device of claim 13, wherein
the second capacitance transistor is placed at an end of the first IO cell closer to the edge of the semiconductor integrated circuit device in the fourth direction as viewed in plan, and
the third capacitance transistor is placed at an end of the second IO cell closer to the core region in the fourth direction as viewed in plan.

* * * * *